(12) United States Patent
Baillon et al.

(10) Patent No.: US 8,035,888 B2
(45) Date of Patent: Oct. 11, 2011

(54) FREQUENCY SHIFTER IN AN OPTICAL PATH CONTAINING A PULSED LASER SOURCE

(75) Inventors: Bertrand Baillon, Valence (FR); Jean-Pierre Schlotterbeck, Rochefort-Samson (FR); Alain Renard, Chabeuil (FR)

(73) Assignee: Thales (FR)

( * ) Notice: Subject to any disclaimer, the term of this patent is extended or adjusted under 35 U.S.C. 154(b) by 0 days.

(21) Appl. No.: 10/592,534

(22) PCT Filed: Mar. 11, 2005

(86) PCT No.: PCT/EP2005/051107
§ 371 (c)(1),
(2), (4) Date: Sep. 12, 2006

(87) PCT Pub. No.: WO2005/099052
PCT Pub. Date: Oct. 20, 2005

(65) Prior Publication Data
US 2007/0159683 A1    Jul. 12, 2007

(30) Foreign Application Priority Data
Mar. 12, 2004 (FR) ...................................... 04 02599

(51) Int. Cl.
*G02F 1/35* (2006.01)
*G02F 2/02* (2006.01)
(52) U.S. Cl. ........ 359/326; 385/122; 356/28.5; 359/331
(58) Field of Classification Search ........................ None
See application file for complete search history.

(56) References Cited

U.S. PATENT DOCUMENTS

| 3,317,078 | A | | 5/1967 | Gordon |
| 3,435,230 | A | * | 3/1969 | Courtney-Pratt et al. ...... 398/201 |
| 3,788,742 | A | * | 1/1974 | Garbuny ...................... 356/5.03 |
| 4,329,664 | A | * | 5/1982 | Javan ............................ 359/276 |
| 4,856,092 | A | | 8/1989 | Wade |
| 5,781,152 | A | | 7/1998 | Renard et al. |
| 5,822,376 | A | | 10/1998 | Renard |
| 5,847,817 | A | | 12/1998 | Zediker et al. |
| 5,850,420 | A | | 12/1998 | Guillard et al. |
| 6,081,691 | A | | 6/2000 | Renard et al. |
| 6,141,086 | A | | 10/2000 | Rogers et al. |
| 6,345,177 | B1 | | 2/2002 | Renard et al. |
| 7,161,528 | B2 | | 1/2007 | Kirby et al. |
| 7,206,546 | B2 | | 4/2007 | Renard et al. |
| 7,295,290 | B2 | * | 11/2007 | Yanagisawa et al. ........ 356/5.15 |
| 7,336,736 | B2 | | 2/2008 | Leblond et al. |
| 7,352,447 | B2 | | 4/2008 | Schlotterbeck et al. |
| 7,352,476 | B2 | | 4/2008 | Baillon et al. |
| 7,386,034 | B2 | | 6/2008 | Korpet et al. |

(Continued)

FOREIGN PATENT DOCUMENTS
CA         2476805 A1    8/2003
(Continued)

*Primary Examiner* — Uyen Chau N Le
*Assistant Examiner* — Chad Smith
(74) *Attorney, Agent, or Firm* — Lowe Hauptman Ham & Berner, LLP

(57) ABSTRACT

The present invention relates to a frequency shifter in an optical path containing a pulsed laser source, and it is characterized in that it comprises at least one frequency shifter (12, 13) containing an optical propagation medium, the optical path length of which is modified according to the desired frequency shift during at least one pulse among n consecutive pulses from the laser, where $n \geq 1$.

6 Claims, 2 Drawing Sheets

U.S. PATENT DOCUMENTS

| | | |
|---|---|---|
| 2002/0075475 A1 | 6/2002 | Holton |
| 2002/0122473 A1 | 9/2002 | Leblond et al. |
| 2002/0154383 A1 | 10/2002 | Oron et al. |
| 2003/0103211 A1 | 6/2003 | Lange et al. |
| 2003/0198271 A1 | 10/2003 | Matveev |
| 2004/0234016 A1 | 11/2004 | Leblond et al. |
| 2007/0159683 A1 | 7/2007 | Baillon et al. |
| 2007/0206190 A1 | 9/2007 | Baillon et al. |

FOREIGN PATENT DOCUMENTS

| | | |
|---|---|---|
| EP | 0536783 A1 | 4/1993 |
| EP | 0 601 847 | 6/1994 |
| EP | 1055941 A2 | 11/2000 |
| FR | 2 757 640 A | 6/1998 |

\* cited by examiner

FREQUENCY SHIFTER IN AN OPTICAL PATH CONTAINING A PULSED LASER SOURCE

The present invention relates to a frequency shifter in an optical path containing a pulsed laser source.

In devices containing a laser source and heterodyne coherent detection, it may be necessary to determine a frequency variation (Doppler effect) that occurs over part of the path of the laser beam, resulting from a physical phenomenon that it is desired to compensate for or measure. This is in particular the case with lidars used for measuring wind speed and direction by the backscattering of the laser beam from aerosol particles carried by the wind. This frequency variation is generally determined by mixing the received signal with a signal generated by a local oscillator affected by a frequency shift produced by an electrooptic or acoustooptic modulator.

Such a modulator device is expensive, bulky and not very discreet, as it radiates at high frequency (presence of harmonics of the fundamental frequency of the signal, which are liable to disturb the signal processing carried out downstream, with a risk of reducing the precision of the speed measurement and of narrowing the spectral measurement window).

The subject of the present invention is a frequency shifter in an optical path containing a pulsed laser source, which shifter is as inexpensive as possible and compact, is not a source of unwanted radiation and can be integrated into a fiber-optic architecture.

The shifter according to the invention comprises at least one frequency shift module containing an optical propagation medium, the optical path length of which is periodically varied during each nth laser beam pulse, where $n \geq 1$, according to the desired frequency shift. The optical propagation medium may either be an optical fiber, an optical waveguide or an electrooptic crystal.

If the system in which the frequency is varied is a lidar, the variation in the optical path length of the optical propagation medium is advantageously a linear variation, and this is achieved during the pulses in question by varying, advantageously in a linear manner, the stress applied to the optical fiber or to the waveguide, or by varying the voltage applied to the electrooptic crystal.

The present invention will be more clearly understood on reading the detailed description of one embodiment, given by way of nonlimiting example and illustrated by the appended drawing in which.

The present invention will be described below with reference to a lidar, but of course it is not limited to this single application—it may be used in various fields in which there is a need to produce a frequency shift over high frequencies, such as frequencies above a few GHz.

Figure 1:
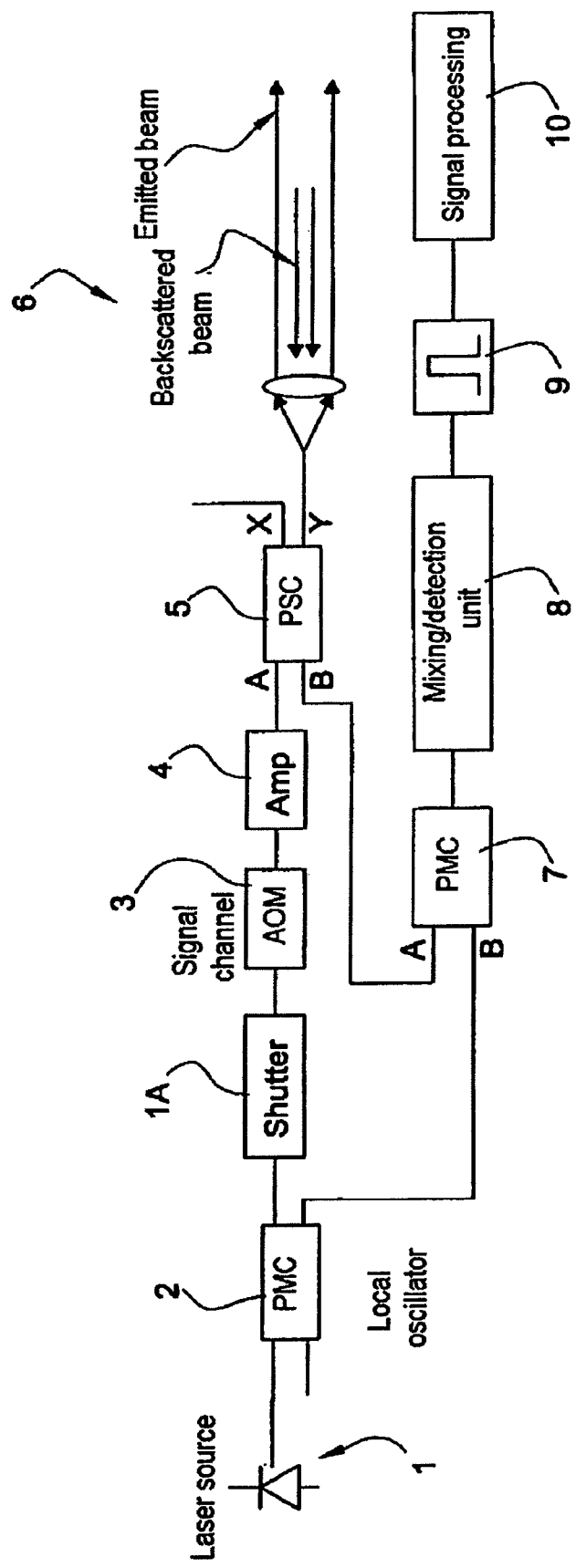
FIG. 1 is a simplified block diagram of a lidar of the prior art, of the type mentioned in the preamble.

FIG. 1 shows a block diagram in which a laser source 1 is connected to one input of a polarization-maintaining coupler 2. A first output of the coupler 2, corresponding to the "signal" channel, is connected, via a shutter 1A, which may be of the electrooptic type, to an acoustooptic modulator 3 followed by an amplifier 4. The amplifier 4 is connected to a first terminal of a polarization-splitting coupler 5. One output of the coupler 5 is connected to a lidar beam emitter/receiver system, indicated in its entirety by the reference 6. The second output of the coupler 2 is connected to a first input of a polarization-maintaining coupler 7, the other input of which is connected to the coupler 5. The output of the coupler 7 is connected to a mixing/detection unit 8, followed by a filtering circuit and signal processing circuits 10.

Figure 2:
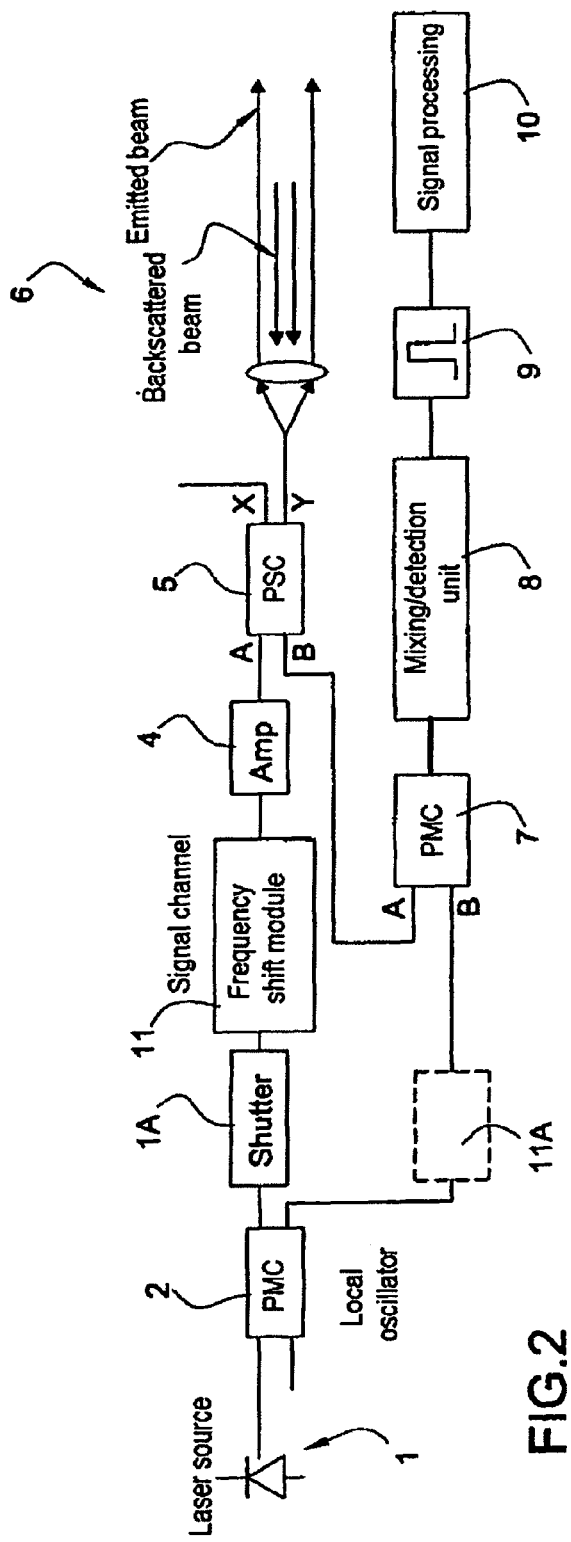
FIG. 2 is a simplified block diagram of a lidar comprising a frequency shift circuit according to the invention.

In the block diagram shown in FIG. 2, the elements similar to those of FIG. 1 are assigned the same numerical references. The essential difference between the systems of FIGS. 1 and 2 is that the modulator 3 of FIG. 1 has been replaced with a frequency shifter 11. The other components of the system shown in FIG. 2 may be the same as those shown in FIG. 1.

The shifter 11 may comprise one or more elementary frequency shift modules. Each of these elementary modules comprises an optical propagation medium, such as an optical fiber, an optical waveguide or an electrooptic crystal. This medium is acted upon so as to vary, periodically, during each nth laser beam pulse, where $n \geq 1$, the optical path length according to the desired frequency shift. This variation in path length corresponds to a variation in the refractive index of the optical medium. If this medium is an optical fiber or a waveguide, this variation may be obtained by imposing a mechanical stress on the optical medium. If it is an electrooptic crystal, the variation is obtained by applying a suitable electrical voltage to its electrodes. In this regard, it is important to note that the electrooptic crystal then does not operate as a conventional electrooptic modulator, but as a device for introducing a shift, which is fixed or variable, in the frequency of the pulsed laser beam that it receives.

In each module, the variation in the mechanical stress or in the electrical voltage is, in the present case, a linear variation as a function of time. This linear variation generates a constant Doppler shift, and consequently a fixed frequency shift between the "signal" and "local oscillator" channels, thereby allowing heterodyne coherent detection. This Doppler shift is imposed on the "signal" channel into which the shifter 11 (as shown by the continuous line in FIG. 2) and/or on the "local oscillator" channel (the second shift module device is then referenced 11A and indicated in FIG. 2 by the broken lines). A variation in the optical path length is generated when velocity of the beam passing through the shifter 11 (and/or 11A) varies. This velocity varies inversely proportionally to the refractive index of the medium through which the beam passes.

According to an alternative embodiment of the invention, the laser beam is passed two or more times through the shifter. The first reason for this is an economic reason: if the voltage slope applied is insufficient to obtain the desired shift over the duration of the pulse, the beam is made to pass through the module again in order to achieve the desired final shift. The second reason is that the shift module could very well be located behind the coupler 5, just before the emission of the beam into the atmosphere, in which case the backscattered beam could itself undergo a shift (identical to or the reverse of the initial shift, or another shift). The frequency shift generated by the shifter 11 (and/or 11A) may be controlled by the measured value of the shift at the output of this shifter. The electrooptic control voltage or the mechanical stress applied to the optical propagation medium of this shifter (and therefore the law of variation of the frequency shift) may therefore be slaved to a fixed or variable value, according to a defined law that depends on the application in question. This frequency shift measurement may be used to determine a noise level or may be used in the post processing carried out in the signal processing circuits for processing the backscattered signal. The invention is also applicable when SSB mixing (in phase and in quadrature) is carried out.

Figure 3:
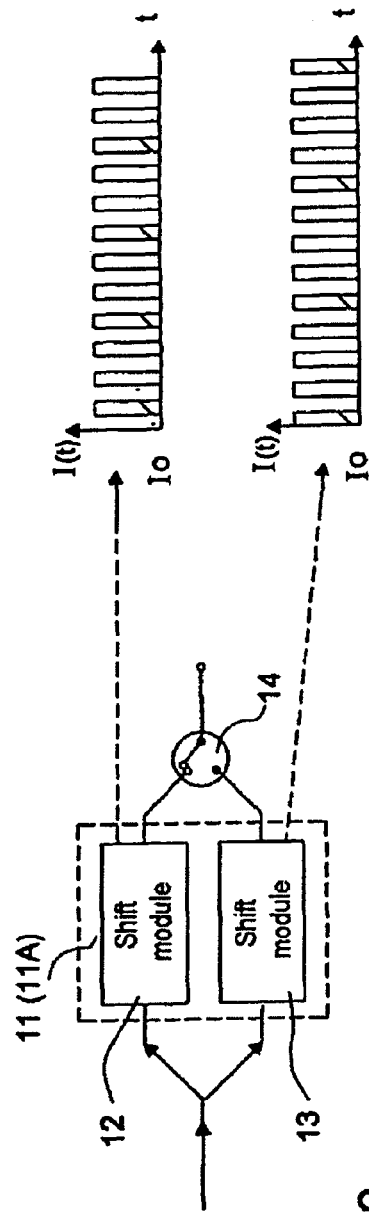
FIG. 3 is a simplified block diagram of an example of a combination of two frequency shift modules according to the invention.

In one advantageous aspect of the invention, and as shown in FIG. 3, the shifter 11 (and/or 11A) is provided with two identical shift modules 12, 13 connected in parallel and followed by a switch 14. Of course, the shifter 11 (and/or 11A) may comprise more than two modules. The shutter 1A is controlled so as to regularly cut off the incident continuous laser beam and thus to produce regularly spaced pulses. According to the invention, a frequency shift is produced periodically, in each shift module 12, 13, for each nth pulse ($n \geq 1$), that is to say the successive pulses are grouped in successive series of n pulses each, and the first pulse of each series is processed by applying said law of variation thereto, these series each comprising at least one pulse. The pulses passing through the module 13 may or may not be synchronous with those passing through the module 12. In the case illustrated in FIG. 3, the pulses passing through the module 13 are shifted in time (using means known per se and not shown) relative to those passing through the module 12. The law of variation applied to the pulses in the module 13 may or may not be different to that applied in the module 12. The switch 14 is controlled so as to collect the output beam from one or other module, for example depending on the nature of the targets directed at by a lidar with which the shifter of the invention is equipped.

According to an alternative embodiment of the invention, only a single shift module is used, the switch 14 then being omitted.

There are many applications of the device of the invention. Apart from the application considered here to telemetry and velocimetry lidars, with, as the case may be, "chirped" beams, mention may be made of telecommunications (for example multiplexers and demultiplexers), the reduction of Brillouin effects in optical waveguides, etc.

The shifter of the invention, thanks to the conventional acoustooptic or electrooptic modulator being replaced with a shifter introducing an optical path length variation, makes it possible to prevent the emission of disturbing harmonics and to avoid producing radio frequency modulation. The mechanical or electrical stresses involved in this shifter are low, and therefore easy to produce. The electrooptic technologies employed by the invention are derived from those commonly employed in telecommunications, the components used being compact and inexpensive, since they are produced in integrated technology. It is also possible to reduce the costs of these components by hybridizing them on a planar waveguide (in integrated optics technology), thereby reducing the number of wire and optical-fiber connections.

The invention claimed is:

1. A method for producing a frequency shift in an optical path containing a pulsed laser source, comprising the steps of:
  introducing a periodic variation into the optical path length of a first frequency shift module during each nth laser beam pulse, including an optical propagation medium according to the desired frequency shift, where $n \geq 1$, by applying, to the first frequency shift module, a control voltage or a mechanical stress that varies linearly as a function of time over this nth pulse wherein at least one second frequency shift module is connected in parallel with the first frequency shift module, a switch being connected to the outputs of these modules and controlled in order to collect the optical output beam of the first or the at least one second frequency shift module.

2. The method according to claim 1, wherein the pulses passing through the first frequency shift module are synchronous with pulses passing through the at least one second frequency shift module.

3. The method according to claim 1, wherein the pulses passing through the first frequency shift module are not synchronous with pulses passing through the at least one second frequency shift module.

4. The method according to claim 1, wherein a law of variation applied to the pulses passing through the first frequency shift module is different from a law of variation applied to the at least one second frequency shift module.

5. The method according to claim 1, wherein a law of variation applied to the pulses passing through the first frequency shift module is the same as a law of variation applied the at least one second frequency shift module.

6. The method according to claim 1, wherein said optical path is connected to a Lidar receiver.

* * * * *